United States Patent [19]
Kovacs et al.

[11] Patent Number: 5,495,512
[45] Date of Patent: Feb. 27, 1996

[54] HYBRID PHASE LOCKED LOOP

[75] Inventors: Janos Kovacs, North Andover; Ronald Kroesen, Harvard, both of Mass.

[73] Assignee: Analog Devices, Inc., Norwood, Mass.

[21] Appl. No.: 314,894

[22] Filed: Sep. 29, 1994

Related U.S. Application Data

[63] Continuation-in-part of Ser. No. 304,248, Sep. 12, 1994.
[51] Int. Cl.$^6$ .................................................. H03D 3/24
[52] U.S. Cl. ............................ 375/376; 375/373; 331/17
[58] Field of Search .................................. 375/120, 371, 375/373, 374, 375; 331/4, 32, 17

[56] References Cited

U.S. PATENT DOCUMENTS

| | | | |
|---|---|---|---|
| 4,890,299 | 12/1989 | Dolivo et al. | 375/18 |
| 4,894,734 | 1/1990 | Fischler et al. | 360/51 |
| 4,929,918 | 5/1990 | Chung et al. | 331/10 |
| 5,136,260 | 8/1992 | Yousefi-Efezei | 331/17 |
| 5,180,933 | 1/1993 | Dent | 331/17 |
| 5,258,933 | 11/1993 | Johnson et al. | 364/602 |
| 5,319,320 | 6/1994 | Abe et al. | 331/17 |

OTHER PUBLICATIONS

Philport et al., "A 7 mbyte/s (65 MHz), Mixed-Signal, Magnetic Recording Channel DSP using Partial Response Signaling With Maximum Likelihood Detection", IEEE Journal, vol. 29, No. 3 Mar. 1994.

*Primary Examiner*—Stephen Chin
*Assistant Examiner*—Huong Luu
*Attorney, Agent, or Firm*—Iandiorio & Teska

[57] ABSTRACT

A phase locked loop system or other second order feedback system whose natural frequency scales with its output and whose damping factor remains constant includes a filter circuit having a scaling channel for scaling the error, an integrating channel for integrating the error, and a summing circuit for combining the scaled error and integrated error; an integrator circuit responsive to the summing circuit to produce an output signal, the gain of the integrator circuit being proportional to its output signal; and a control circuit for controlling the gain of the integrating channel proportional to the output signal and maintaining constant the ratio of and scaling the product of the unity gained frequency and the zero frequency of the feedback system to keep constant the damping factor and to scale the natural frequency of the feedback system with the output signal, respectively.

34 Claims, 3 Drawing Sheets

_5,495,512_

HYBRID PHASE LOCKED LOOP

RELATED CASE

This application is a continuation-in-part of a U.S. patent application Ser. No. 08/304,248, filed on Sep. 12, 1994, entitled "Center Frequency Controlled Phase Locked Loop System", by Kovacs et al.

FIELD OF INVENTION

This invention relates to a second order feedback circuit such as a phase locked loop (PLL) whose natural frequency scales with its output and whose damping factor remains constant over the frequency range.

BACKGROUND OF INVENTION

Conventional second order feedback circuits such as phase locked loop (PLL) circuits may be analog, continuous time types or digital, discrete time types. The analog, continuous time types (PLLs) use a phase detector to determine any shift in phase and energize a charge pump accordingly. The charge pump output representing the amount and polarity of the difference in phase is passed through a filter to provide a signal to operate a voltage controlled oscillator to adjust the frequency of a clock signal provided to the phase detector to realign the phase of the clock and input signal. These analog type of PLLs have the disadvantage that they do not scale well and their damping characteristics vary with variations in the operating frequency. Digital, discrete time PLLs do not have these disadvantages but have the disadvantage that their digital loop filters are costly, large and complex and require a good deal of power.

SUMMARY OF INVENTION

It is therefore an object of this invention to provide an improved hybrid analog/digital second order feedback system such as a phase locked loop system.

It is a further object of this invention to provide an improved hybrid analog/digital second order feedback system which includes desirable performance features of a digitally implemented loop filter and the desirable structural features of an analog implemented loop filter.

It is a further object of this invention to provide an improved hybrid analog/digital second order feedback system which scales the natural frequency of the feedback loop with the clock or output frequency.

It is a further object of this invention to provide an improved hybrid analog/digital second order feedback system which controls the damping factor.

It is a further object of this invention to provide an improved hybrid analog/digital second order feedback system which replaces large, costly and complex digital hardware with smaller, less expensive, simpler analog hardware.

It is a further object of this invention to provide an improved hybrid analog/digital second order feedback system in which the scale factor and damping factor are programmable.

The invention results from the realization that a truly effective loop filter for a phase locked loop (PLL) or other second order feedback circuit having the size, cost and simplicity of an analog filter and the control of the damping factor and the control of the scaling factor of a digital filter can be achieved by controlling the unity gain frequency and zero frequency in accord with the clock or other output signal so that their ratio remains the same to keep constant the damping factor and so that their product scales the natural frequency of the loop with the output signal frequency.

This invention features a phase locked loop system whose natural frequency scales with the output clock frequency of the voltage controlled oscillator (VCO) and whose damping factor remains constant. There is a filter circuit having a scaling channel for scaling the phase error, an integrating channel for integrating the phase error, and a summing circuit for combining the scaled phase error and the integrated phase error. A voltage controlled oscillator VCO is responsive to the summing circuit to produce an output. The VCO's gain is proportional to its output clock frequency. A control circuit controls the gain of the integrating channel proportional to the output clock frequency of the VCO and maintains constant the ratio of and scales the product of the unity gain frequency and the zero frequency of the phase locked loop to keep constant the damping factor and to scale the natural frequency of the phase locked loop with the output clock frequency of the VCO, respectively.

In a preferred embodiment the scaling channel may include a resistance and it may include an amplifier for providing a current to the resistance. It may alternatively provide a digital to analog converter for providing current to the resistance. The integrating channel may include a capacitance and it may include an amplifier or a digital to analog converter for providing current to the capacitance. The control circuit may include a feedback circuit. The voltage controlled oscillator VCO may include a voltage to current converter amplifier circuit and a current controlled oscillator responsive to the current converter amplifier circuit and a control device for setting the gain of the voltage to current converter in proportion to the output clock frequency.

In a broader sense the invention features a second order feedback system whose natural frequency scales with its output and whose damping factor remains constant. There is a filter circuit having a scaling channel for scaling the error, an integrating channel for integrating the error, and a summing circuit for combining the scaled error and the integrated error. An integrator circuit is responsive to the summing circuit to produce an output signal. The gain of the integrator circuit is proportional to the output signal. A control circuit controls the gain of the integrating channel proportional to the output signal and maintains constant the ratio of and scaling the product of the unity gain frequency and the zero frequency of the feedback system to keep constant the damping factor and to scale the natural frequency of the feedback system with the output signal, respectively.

In a preferred embodiment the scaling channel may include a resistance and it may include an amplifier or a digital to analog converter for providing a current to the resistance. The integrating channel may include a capacitance and it may include an amplifier or a digital to analog converter for providing current to the capacitor. The control device may include a feedback circuit. The integrating circuit may include a voltage to current converter amplifier circuit and a current controlled oscillator responsive to the current converter amplifier circuit and a current controlled oscillator responsive to the current converter amplifier circuit and a control device for setting the gain of the voltage to current converter in proportion to the output signal.

DISCLOSURE OF PREFERRED EMBODIMENT

Other objects, features and advantages will occur to those skilled in the art from the following description of a preferred embodiment and the accompanying drawings in which.

It is a goal of this invention to keep constant or control the damping factor in a second order feedback system such as a phase locked loop. It is also a goal of this invention to provide scaling of the natural frequency of the loop in accordance with the clock output or other output signal. It is understood that the damping factor is defined as:

$$1/2 \sqrt{\frac{\omega_0}{\omega_z}} \quad (1)$$

where $\omega_0$ is defined as the unity gain frequency of the open loop transfer function and $\omega_z$ is the zero frequency point, that is, the point at which the gain changes slope. In a simple analog filter $\omega_z$ would be defined simply as $\omega_z=1/RC$. Thus if $\omega_0$ and $\omega_z$ can be made to move together so that the ratio does not change, the damping factor will indeed remain constant. This can be accomplished by causing both $\omega_0$ and $\omega_z$ to move in accordance with the output signal from the second order feedback loop, for example the clock output of a phase locked loop. Separately, the natural frequency, $\omega_n$, is defined as:

$$\sqrt{\omega_0 \cdot \omega_z} \quad (2)$$

Thus if $\omega_0$ and $\omega_z$ can both be made to move or to follow the output signal of the second order feedback system, for example the clock output of a VCO in a phase locked loop, the natural frequency, $\omega_n$, will follow the output or clock signal. This invention recognizes that by dividing the loop filter into two channels, a scaling channel and an integrating channel in a phase locked loop for example, and controlling the gain of the integrating channel, the zero frequency $\omega_z$ can be controlled, and that in the phase locked loop system, for example, where a VCO is used to develop the output clock signal, the gain of a voltage to current converter which feeds a current controlled oscillator can be controlled to control the unity gain frequency $\omega_0$. If the gain of the voltage to current converter and the gain of the amplifier with an integrating channel can both be made to follow the output clock signal or some signal proportional to it, then both goals will have been realized: the damping factor will remain constant and the natural frequency will scale with the clock frequency or other output of the system. Further background can be understood from the related case, filed Sep. 12, 1994, entitled "Center Frequency Controlled Phase Locked Loop System", by Kovacs et al., which is incorporated herein by reference in its entirety.

Figure 1:
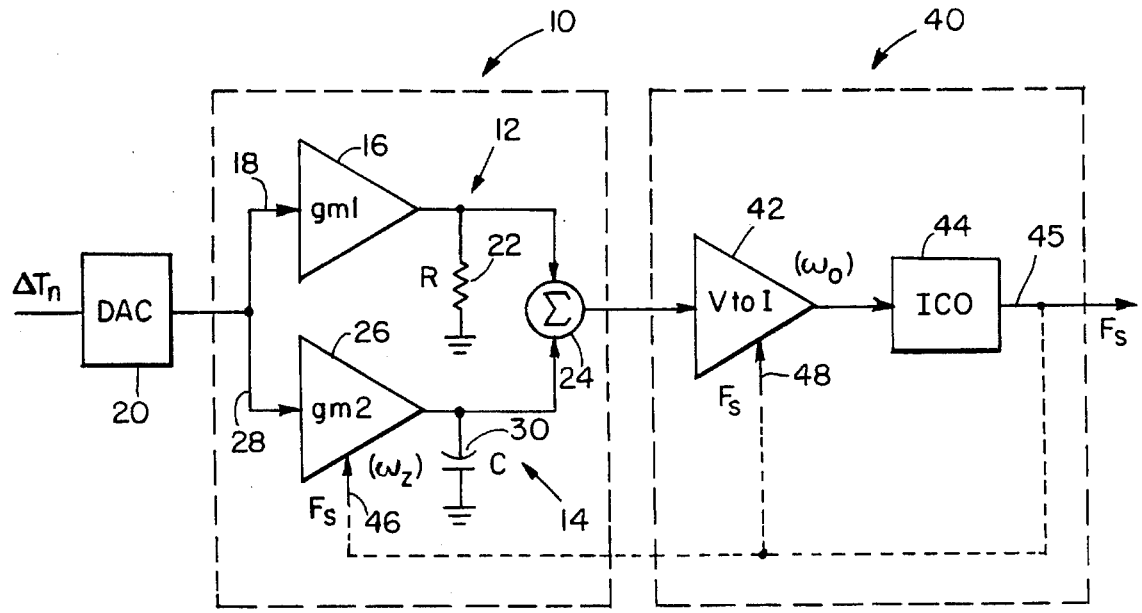
FIG. 1 is a schematic block diagram of a hybrid analog/digital loop filter according to this invention showing a portion of a phase locked loop circuit including a digital to analog converter (DAC) and a voltage controlled oscillator (VCO)

In one embodiment, FIG. 1, loop filter 10 includes two channels, scaling channel 12 and integrating channel 14. Scaling channel 12 includes a transconductance amplifier 16 which receives a voltage input on line 18 from digital to analog converter DAC 20 which forms a part of the phase locked loop. Transconductance amplifier 16 provides a current output to resistor R 22, which is one part of an RC filter network. The output from transconductance amplifier 16 and resistor 22 is delivered to summing circuit 24. Integrating channel 14 also includes a transconductance amplifier 26 which receives a voltage input at 28 from DAC 20 and provides a current to capacitor C 30. The output from transconductance amplifier 26 and capacitor 30 is also delivered to summing circuit 24. The combined output from summing circuit 24 provides one input to voltage control oscillator 40 which includes a voltage to current converter 42 and a current controlled oscillator (ICO) 44. The separating of the R 22 and C 30 components of the RC filter are necessary so that different currents can flow through R 22 and C 30. If that were not true then $\omega_z$ could not be tuned or adjusted. Thus in accordance with this invention, by providing a control signal to transconductance amplifier 26 to adjust its gain, the zero frequency, $\omega_z$, can be adjusted. If the control signal 46 is for example $F_s$, which is the output on line 45 from ICO 44, then $\omega_z$ can be made to track the clock signal from ICO 44. In a similar fashion the output from ICO 44, $F_s$, can be applied at control input 48 to control the gain of voltage to current converter 42 to adjust the unity gain frequency $\omega_0$. Since both of these gains are controlled by the same signal $F_s$, then $\omega_z$ and $\omega_0$ will move synchronously so that their ratio will remain the same and thus the damping factor will be kept constant. In addition, since both $\omega_z$ and $\omega_0$ are adjusted in accordance with the same signal $F_s$, and since $F_s$ is the output or clock signal, they will both follow or scale with $F_s$, and so their product will as well. Thus the natural frequency $\omega_n$ will scale with the clock or output frequency $F_s$.

Figure 2:
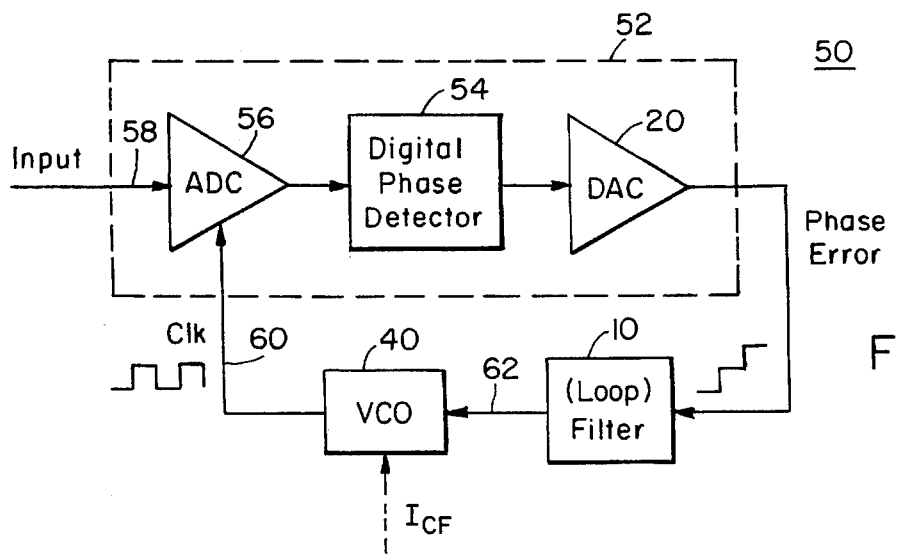
FIG. 2 is a schematic block diagram of a phase locked loop system incorporating the hybrid analog/digital loop filter of FIG. 1.

Loop filter 10, along with DAC 20 and VCO 40, can be used in a hybrid analog/digital phase locked loop system 50, FIG. 2. Phase locked loop system 50 includes phase detector 52 which includes DAC 20 as well as digital phase detector 54 and analog to digital converter (ADC) 56. A typical digital phase detector 54 is explained in U.S. Pat. No. 5,258,933, Johnson et al., Nov. 2, 1993, "Timing Control for PRML Class IV Sampling Data Detection Channel".

Figure 3:
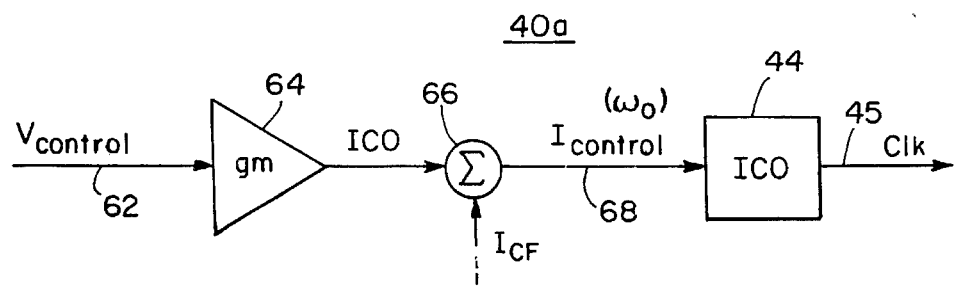
FIG. 3 is a schematic block diagram of another form of VCO illustrating another method of controlling the VCO gain in proportion to its output.
Figure 4:
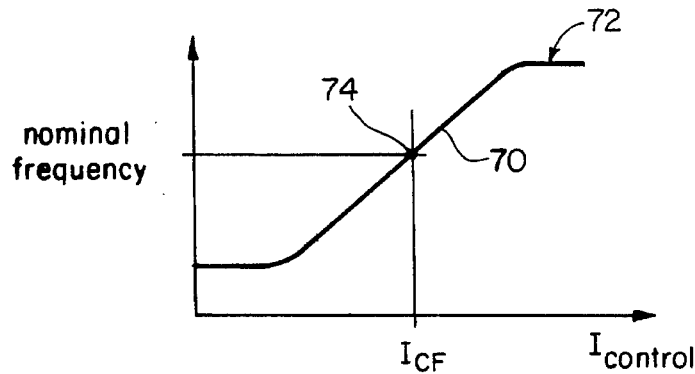
FIG. 4 is a graphical illustration showing the nominal frequency for the ICO of FIG. 3.

In operation, the analog input to phase locked loop system 50 is delivered on line 58 to ADC 56. The digital output is delivered to digital phase detector 54, which detects any difference in phase between the clock output on line 60 from VCO 40 and the analog input 58. The digital error signal is delivered to DAC 20 which converts it to an analog signal that is then processed in loop filter 10 as previously explained with respect to FIG. 1. VCO 40 may be controlled by a current representing the center frequency or nominal frequency of operation $I_{CF}$, in addition to the signal coming from loop filter 10 on line 62. In that instance the voltage controlled oscillator may be implemented as shown by VCO 40a, FIG. 3, wherein the control signal on line 62 is delivered to a transconductance amplifier 64 whose output is delivered to a summing circuit 66. Summing circuit 66 combines the current output from transconductance amplifier 64 and the $I_{CF}$ signal to provide the control signal on line 68 to ICO 44. In this case $\omega_0$ will still be controlled and scaled with the output signal from ICO 44 on line 45 but it does not actually use that signal. That is, $I_{CF}$ is proportional to the output $F_S$ on line 45 and it is used to set the gain of transconductance amplifier 64, and it would be used as well to set the gain of transconductance amplifier 26, FIG. 1. Typically the center frequency current $I_{CF}$ is chosen on a constant slope portion 70, FIG. 4, of the output frequency versus current transfer characteristic 72 of the current controlled oscillator. Typically $I_{CF}$ is chosen so that the nominal operating point is generally in the center of the constant slope section 70.

Figure 5:
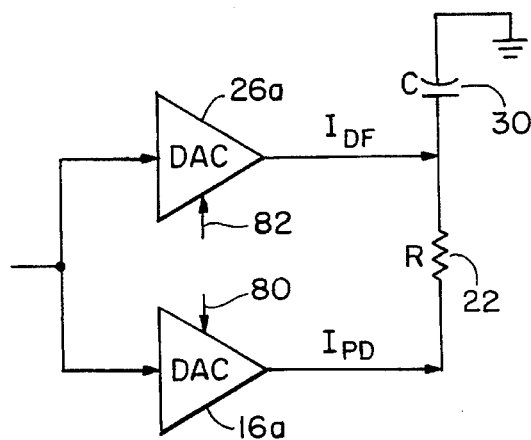
FIG. 5 is a schematic block diagram of an alternative form of loop filter according to this invention in which digital to analog converters (DACs) are used in place of the transconductance amplifiers of FIG. 1.

Although in FIG. 1 DAC 20 and transconductance amplifiers 16 and 26 are shown as separate components, this is not a necessary limitation of the invention. For example, as shown in FIG. 5, transconductance amplifier 16 is replaced by DAC 16a and transconductance amplifier 26 is replaced by DAC 26a. DAC 16a is programmable by a control circuit 80 and DAC 26a is programmable through control circuit 82, so that any desirable gain can be set in either or both of DACs 16a and 26a. The DACs also can have differing resolutions if desired. Further, the R 22 and C 30 may be connected together once again so that the summer 24 can be eliminated. Even though resistance R 22 and capacitance C 30 are now connected together, the separate control is still available since the current that comes to each of them is different. The current through resistance R 22 comes wholly from DAC 16a, whereas the current flowing through capacitor 30 is a combination of the current from DAC 26a and the current from DAC 16a. Thus the current through R22 and C30 can each be changed independently of the other.

Figure 6:
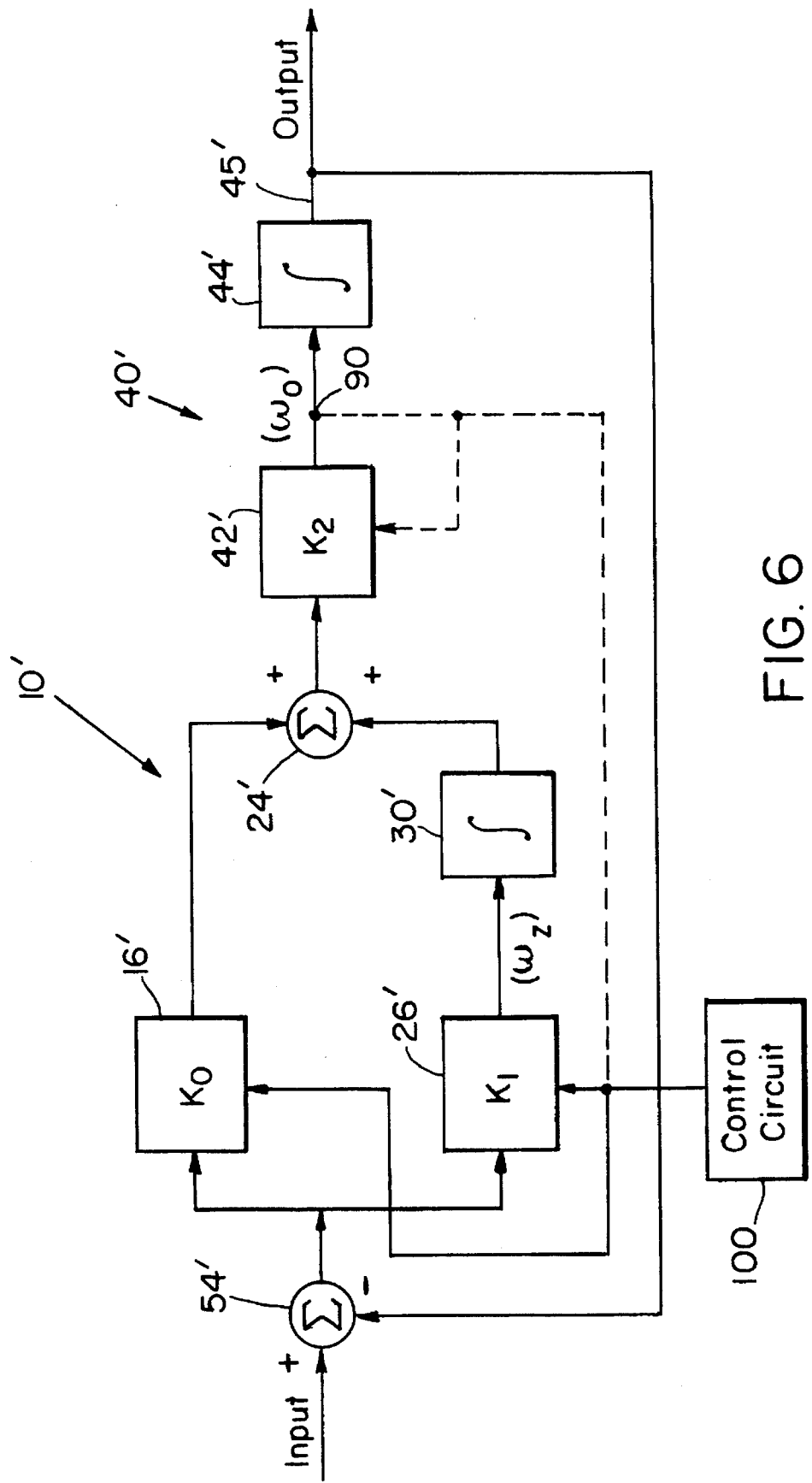
FIG. 6 is a schematic block diagram of a generalized second order feedback system employing this invention.

Although thus far the embodiment relates to a phase locked loop system, the invention can be used in any second order feedback system as shown generally in FIG. 6. There the digital phase detector is shown generally as summer 54' and the loop filter 10' is shown to include two gain components 16' and 26' having gains $K_0$ and $K_1$, which generally take the place of the transconductance amplifiers 16 and 26. An integrating component 30' such as previously implemented by capacitor 30, FIG. 1, is also included, as is a summer 24'. The output circuit again includes a gain component $K_2$ 42' and an integrating device 44'. The control signals to control the gains $K_1$ and $K_2$ come from a center frequency current point 90 as opposed to the output 45'. The control signal comes directly from the gain component $K_2$ 42' at 90 rather than from output 45'.

Figure 7:
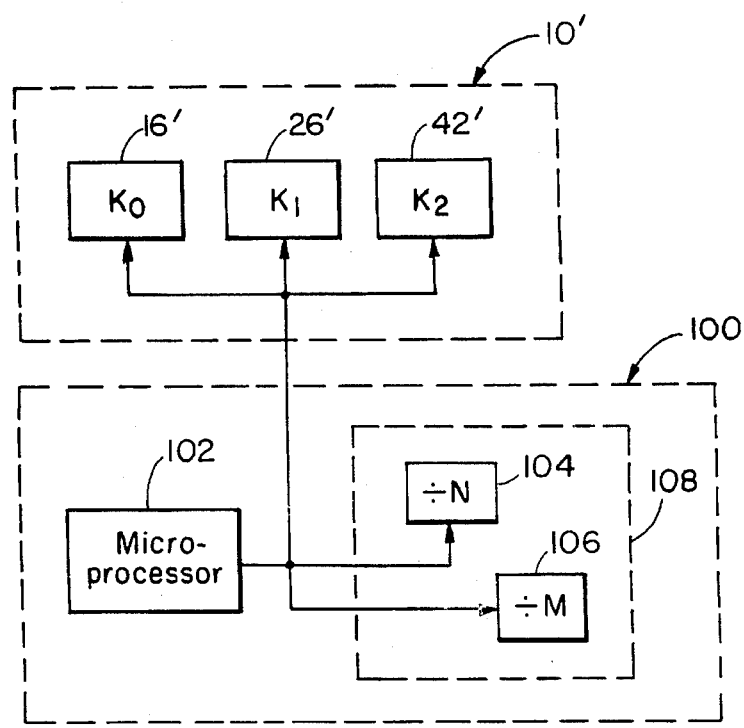
FIG. 7 is a more detailed schematic block diagram of the control circuit of FIG. 6.

The control signals to amplifiers 16', 26' and 42', FIG. 6, are not limited to being derived from summing point 90. A completely separate control circuit 100 may be employed to provide those signals and also provide similar signals on lines 80, 82 in FIG. 5 as well as the control signals $F_S$ on lines 46 and 48 in FIG. 1. One example of such a control circuit, FIG. 7, includes a microprocessor 102 which sets the N and M values in the divide by N 104 and divide by M 106 circuits in a conventional frequency synthesizer phase locked loop 108. In conjunction with this, microprocessor 102 sets the gain values in amplifiers $K_0$ 16', $K_1$ 26', and $K_2$ 42', so the constant damping factor and natural frequency that scales with the output 45' is achieved.

Other embodiments will occur to those skilled in the art and are within the following claims:

What is claimed is:

1. A phase locked loop (PLL) system whose natural frequency scales with an output clock frequency of a voltage controlled oscillator (VCO) and whose damping factor remains constant comprising:

a filter circuit having a scaling channel for scaling a phase error to obtain a scaled phase error; an integrating channel for integrating the phase error to obtain an integrated phase error; and a summing circuit for combining the scaled phase error and the integrated phase error;

the voltage controlled oscillator (VCO) being responsive to said summing circuit to produce the output clock frequency, said VCO's having a gain that is proportional to its output clock frequency; and a control circuit including a feedback loop for controlling the gain of said integrating channel proportional to the output clock frequency of said VCO and maintaining constant the ratio of and scaling the product of, the unity gain frequency and the zero frequency of the PLL to keep constant the damping factor and to scale the natural frequency of the PLL with the output clock frequency of the VCO, respectively.

2. The phase locked loop system of claim 1 in which said scaling channel includes a resistance.

3. The phase locked loop system of claim 2 in which said scaling channel includes an amplifier for providing a current to said resistance.

4. The phase locked loop system of claim 2 in which said scaling channel includes a digital to analog converter for providing a current to said resistance.

5. The phase locked loop system of claim 1 in which said integrating channel includes a capacitance.

6. The phase locked loop system of claim 5 in which said integrating channel includes an amplifier for providing current to said capacitance.

7. The phase locked loop system of claim 5 in which said integrating channel includes a digital to analog converter for providing current to said capacitance.

8. The phase locked loop system of claim 1 in which said VCO includes a voltage to current converter amplifier circuit and a current controlled oscillator (ICO) responsive to said converter amplifier circuit and a control device for setting the gain of said voltage to current converter in proportion to said output clock frequency.

9. A second order feedback system whose natural frequency scales with its output and whose damping factor remains constant, comprising:

a filter circuit having a scaling channel for scaling a phase error to obtain a scaled phase error; an integrating channel for integrating the phase error to obtain an integrated phase error; and a summing circuit for combining the scaled phase error and the integrated phase error;

an integrator circuit, responsive to said summing circuit to produce an output signal, the gain of said integrator circuit being proportional to the output signal; and a control circuit including a feedback loop for controlling the gain of said integrating channel proportional to the output signal and for maintaining constant the ratio of and scaling the product of the unity gain frequency and the zero frequency of the feedback system to keep constant the damping factor and to scale the natural frequency of the feedback system with said output signal, respectively.

10. The feedback system of claim 9 in which said scaling channel includes a resistance.

11. The feedback system of claim 10 in which said scaling channel includes an amplifier for providing a current to said resistance.

12. The feedback system of claim 10 in which said scaling channel includes a digital to analog converter for providing a current to said resistance.

13. The feedback system of claim 9 in which said integrating channel includes a capacitance.

14. The feedback system of claim 13 in which said integrating channel includes an amplifier for providing current to said capacitance.

15. The feedback system of claim 13 in which said integrating channel includes a digital to analog converter for providing current to said capacitance.

16. The feedback system of claim 9 in which said integrator circuit includes a voltage to current converter amplifier circuit and a current controlled oscillator (ICO) responsive to said circuit converter amplifier circuit and a control device for setting the gain of said voltage to current converter in proportion to said output signal.

17. A phase locked loop (PLL) system whose natural frequency scales with an output clock frequency of a voltage controlled oscillator (VCO) and whose damping factor remains constant, comprising:

a filter circuit having a scaling channel for scaling a phase error to obtain a scaled phase error, an integrating channel for integrating the phase error to obtain an integrated phase error and a summing circuit for combining the scaled phase error and the integrated phase error;

the VCO being responsive to said summing circuit to produce the output clock frequency, said VCO having a gain that is proportional to its output clock frequency; and means for controlling the gain of said integrating channel proportional to the output clock frequency of said VCO and maintaining constant the ratio of and scaling the product of, the unity gain frequency and the zero frequency of the PLL to keep constant the damping factor and to scale the natural frequency of the PLL with the output clock frequency of the VCO, respectively.

18. The phase locked loop system of claim 17 in which said scaling channel includes a resistance.

19. The phase locked loop system of claim 18 in which said scaling channel includes an amplifier for providing a current to said resistance.

20. The phase locked loop system of claim 18 in which said scaling channel includes a digital to analog converter for providing a current to said resistance.

21. The phase locked loop system of claim 17 in which said integrating channel includes a capacitance.

22. The phase locked loop system of claim 21 in which said integrating channel includes an amplifier for providing current to said capacitance.

23. The phase locked loop system of claim 21 in which said integrating channel includes a digital to analog converter for providing current to said capacitance.

24. The phase locked loop system of claim 17 in which said means for controlling includes a feedback circuit.

25. The phase locked loop system of claim 17 in which said VCO includes a voltage to current converter amplifier circuit and a current controlled oscillator (ICO) responsive to said converter amplifier circuit and a control device for setting the gain of said voltage to current converter in proportion to said output clock frequency.

26. A second order feedback system whose natural frequency scales with its output and whose damping factor remains constant, comprising:

a filter circuit having a scaling channel for scaling a phase error to obtain a scaled phase error, an integrating channel for integrating the phase error to obtain an integrated phase error and a summing circuit for combining the scaled phase error and the integrated phase error;

an integrator circuit, responsive to said summing circuit, to produce an output signal, the gain of said integrator circuit being proportional to the output signal; and means for controlling the gain of said integrating channel proportional to the output signal and for maintaining constant the ratio of and scaling the product of the unity gain frequency and the zero frequency of the feedback system to keep constant the damping factor and to scale the natural frequency of the feedback system with said output signal, respectively.

27. The feedback system of claim 26 in which said scaling channel includes a resistance.

28. The feedback system of claim 27 in which said scaling channel includes an amplifier for providing a current to said resistance.

29. The feedback system of claim 27 in which said scaling channel includes a digital to analog converter for providing a current to said resistance.

30. The feedback system of claim 26 in which said integrating channel includes a capacitance.

31. The feedback system of claim 30 in which said integrating channel includes an amplifier for providing current to said capacitance.

32. The feedback system of claim 30 in which said integrating channel includes a digital to analog converter for providing current to said capacitance.

33. The feedback system of claim 26 in which said means for controlling includes a feedback circuit.

34. The feedback system of claim 26 in which said integrator circuit includes a voltage to current converter amplifier circuit and a current controlled oscillator (ICO) responsive to said circuit converter amplifier circuit and a control device for setting the gain of said voltage to current converter in proportion to said output signal.

\* \* \* \* \*